United States Patent
Wenski (10) Patent No.: US 6,566,267 B1
(45) Date of Patent: May 20, 2003

(54) INEXPENSIVE PROCESS FOR PRODUCING A MULTIPLICITY OF SEMICONDUCTOR WAFERS

(75) Inventor: Guido Wenski, Burghausen (DE)

(73) Assignee: Wacker Siltronic Gesellschaft für Halbleitermaterialien AG, Burghausen (DE)

( * ) Notice: Subject to any disclaimer, the term of this patent is extended or adjusted under 35 U.S.C. 154(b) by 2 days.

(21) Appl. No.: 09/716,087

(22) Filed: Nov. 17, 2000

(30) Foreign Application Priority Data

Nov. 23, 1999 (DE) .......................... 199 56 250

(51) Int. Cl.⁷ .......................... H01L 21/461
(52) U.S. Cl. .................. 438/692; 438/459; 438/464; 216/91
(58) Field of Search .............. 438/14, 107, 459, 438/464, 692, 695, 928, 693; 216/88, 89, 90, 91

(56) References Cited

U.S. PATENT DOCUMENTS

| 3,615,463 A | * 10/1971 | Kushchell .................. 96/36.2 |
| 3,691,694 A | 9/1972 | Goetz et al. |
| 3,857,123 A | 12/1974 | Walsh |
| 4,739,589 A | * 4/1988 | Brehm et al. .................. 51/281 |
| 5,658,185 A | 8/1997 | Morgan, III et al. |
| 5,756,399 A | 5/1998 | Hajime et al. |
| 5,899,743 A | * 5/1999 | Kai et al. .................. 438/690 |
| 5,928,962 A | 7/1999 | Farkas et al. |
| 6,117,776 A | * 9/2000 | Huber et al. .................. 438/691 |
| 6,284,658 B1 | * 9/2001 | Kato et al. |
| 6,323,140 B1 | * 11/2001 | Mayusumi et al. .......... 438/787 |
| 6,338,805 B1 | * 1/2002 | Anderson .................... 216/89 |

FOREIGN PATENT DOCUMENTS

| DE | 198 33 257 | 9/1999 |
| DE | 199 05 737 | 8/2000 |
| EP | 0 208 315 | 9/1990 |
| EP | 0 754 785 | 1/1997 |
| EP | 0 755 751 | 1/1997 |
| EP | 0 798 405 | 10/1997 |
| EP | 866497 | * 3/1998 .......... H01L/21/66 |
| EP | 0 866 497 | 9/1998 |
| EP | 0 961 314 | 12/1999 |

OTHER PUBLICATIONS

English Derwent Abstract AN 2000–579981 [55] corresp. to DE 199 05 737.
English Derwent Abstract AN 2000–015536 [02] corresp. to EPO 961 314.
English Derwent Abstract AN 1999–519699 [44] corresp. to DE 198 33 257.
English Derwent Abstract AN 1987–008979 [02] corresp. to EP 0 208 315.

* cited by examiner

*Primary Examiner*—Amir Zarabian
*Assistant Examiner*—Pamela Perkins
(74) *Attorney, Agent, or Firm*—Collard & Roe, P.C.

(57) ABSTRACT

A process for producing a multiplicity of semiconductor wafers, which includes the following individual steps: (a) simultaneous polishing a front side and a back side of each semiconductor wafer between rotating polishing plates with a polishing fluid being supplied, the semiconductor wafer in each case resting in a cutout in a carrier and being kept on a specific geometric path, and all semiconductor wafers having a thickness $t_1$ following the polishing; (b) assessment of each semiconductor wafer with regard to quality features which are stipulated for further processing; (c) further simultaneous polishing a front side and a back side of each of those semiconductor wafers which, according to quality inspection (b), do not satisfy the stipulated quality features, these semiconductor wafers having a thickness $t_2$ following the further polishing; and (d) further assessment of each of those semiconductor wafers which were fed to step (c) with regard to quality features stipulated for further processing.

13 Claims, 6 Drawing Sheets

INEXPENSIVE PROCESS FOR PRODUCING A MULTIPLICITY OF SEMICONDUCTOR WAFERS

BACKGROUND OF THE INVENTION

1. Field of the Invention

The present invention relates to an inexpensive process for producing a multiplicity of semiconductor wafers with a local flatness, expressed as the $SFQR_{max}$ value for a surface grid of 25 mm×25 mm, of less than or equal to 0.13 µm. Semiconductor wafers with a high flatness of this nature are suitable for use in the semiconductor industry, in particular for the fabrication of electronic components with line widths of less than or equal to 0.13 µm.

2. The Prior Art

A semiconductor wafer which is to be suitable in particular for the fabrication of electronic components with line widths of less than or equal to 0.13 µm must have a high local flatness in all partial areas. A suitable measure of flatness which takes into account the focussing capabilities of a stepper, is the SFQR (site front-surface referenced least squares-range=range of the positive and negative deviation from a front surface defined by minimizing the mean square error for a component area of defined size). The parameter $SFQR_{max}$ specifies the maximum SFQR value for all the component areas on a semiconductor wafer. A generally accepted rule of thumb states that the $SFQR_{max}$ value of a semiconductor wafer must be less than or equal to the possible line width on this wafer for semiconductor components that are to be produced on it. If this value is exceeded, the stepper experiences focussing problems and the component in question is thus lost.

The final flatness of a semiconductor wafer is generally produced by a polishing process. In order to improve the flatness values of a semiconductor wafer, apparatuses and processes for the simultaneous polishing of front and back sides of the semiconductor wafer have been provided and developed further. This so-called double-side polishing is described for example in U.S. Pat. No. 3,691,694. In accordance with an embodiment of double-side polishing which is described in EP 208 315 B1, semiconductor wafers in carriers which are made of metal or a plastics material and have suitably dimensioned cutouts are moved along a path. This path is predetermined by the machine and process parameters between two rotating polishing plates, which are covered with a polishing cloth, in the presence of a polishing fluid, and hence polished.

It is known to integrate double-side polishing into process sequences for producing semiconductor wafers. EP 754 785 A1 describes the sequence of sawing a semiconductor crystal, followed by edge rounding, double-side polishing and final polishing of the semiconductor wafers obtained. In EP 755 751 A1, it is proposed to employ a double-side grinding process between the edge rounding and double-side polishing. EP 798 405 A2 describes the sequence of sawing—edge rounding—grinding—alkaline etching—double-side polishing. The preferred embodiments of U.S. Pat. No. 5,756,399 include the process sequence of sawing—grinding—alkaline etching—edge rounding—double-side polishing. U.S. Pat. No. 5,899,743 describes the sequence of steps of sawing—edge rounding—lapping—double-side polishing—edge polishing—final polishing. DE 198 33 257 C1 discloses the process sequence of sawing—edge rounding—grinding —etching—double-side polishing—final polishing, the etching in this case being carried out using an improved acid etching process. A common feature of these process sequences is that after the double-side polishing they lead to a semiconductor wafer with $SFQR_{max}$ values of greater than 0.13 µm.

The production of a semiconductor wafer with $SFQR_{max}$ values of less than or equal to 0.13 um is described in EP 961 314 A1 which describes the use of expensive plasma etching processes. This production also forms the subject of DE 199 05 737 A1. This discloses an improved double-side polishing process by maintaining tightly restricted thickness ratios between carrier thickness and thickness of the semiconductor wafer after the polishing process. This application specifies that preferably from 10 µm to 60 µm, and particularly preferably 20 µm to 50 µm, of material are removed in the case of the polishing of silicon wafers. A common feature of both processes is that a percentage of wafers produced in this way do not satisfy the quality features stipulated for further processing, such as a surface which is free from flaws in terms of scratches, stains and light point defects. This percentage always occurs in practical operation, and thus has to be discarded, which has an adverse effect on the production costs for wafers of this nature.

SUMMARY OF THE INVENTION

Therefore, it is an object of the present invention to provide a process for producing a multiplicity of semiconductor wafers with an $SFQR_{max}$ value of less than or equal to 0.13 µm which is superior to the known processes of the prior art in terms of the production costs. Furthermore, it was intended that the further properties of the semiconductor wafers produced using this process should be at least as good as those of semiconductor wafers produced according to the prior art.

This object is achieved according to the present invention by providing a process for producing a multiplicity of semiconductor wafers, which comprises the following individual steps:

(a) simultaneously polishing a front side and a back side of each semiconductor wafer between rotating polishing plates with a polishing fluid being supplied, the semiconductor wafer in each case resting in a cutout in a carrier and being kept on a specific geometric path, and all semiconductor wafers having a thickness $t_1$ following the polishing;

(b) assessment of each semiconductor wafer with regard to quality features which are stipulated for further processing;

(c) further simultaneously polishing a front side and a back side of each of those semiconductor wafers which, according to quality inspection (b), do not satisfy the stipulated quality features, these semiconductor wafers having a thickness $t_2$ following the further polishing; and (d) further assessment of each of those semiconductor wafers which were fed to step (c) with regard to quality features stipulated for further processing.

An essential feature of the invention is that those semiconductor wafers from a multiplicity of double-side polished semiconductor wafers which do not satisfy the quality features specified for further processing can be fed to a further double-side polishing step. Thus there will be an increasing of the overall yield and therefore a reduction in production costs. Also the reduction in thickness can be selected to be sufficiently small for it to be possible to maintain the standard tolerances for the wafer thickness which are required in semiconductor fabrication. In the description which follows, double-side polishing in which only a relatively small reduction in thickness is desired is referred to as flash DSP. The fact that a flash DSP process of this nature allows flawed semiconductor wafers to be machined with a high yield without having an adverse effect on the local geometry values was unexpectedly surprising and not predictable.

The starting product for the process is a multiplicity of semiconductor wafers which have been cut from a crystal in a known way. For example these wafers are from a single silicon crystal which has been cut to length and cylindrically ground, have had their edges rounded by means of a suitably profiled grinding wheel or a plurality of different grinding wheels of this nature and whose front and/or back sides have if appropriate been treated by means of grinding, lapping and/or etching processes. If desired, the crystal may be provided with one or more orientation features in order to identify the crystal axes, for example with a notch and/or a flat. Furthermore, it is possible for the edge of the semiconductor wafers to be polished before the process according to the invention is carried out.

The end product of the process is a multiplicity of double-side polished semiconductor wafers which satisfy the demands imposed on semiconductor wafers to be used as starting material for semiconductor component processes with line widths of less than or equal to 0.13 $\mu$m. The inventive wafers are superior to the semiconductor wafers produced according to the prior art in terms of their production costs on account of high yields and/or reduced levels of material abrasion.

The process according to the invention may in principle be used to produce a multiplicity of wafer-like bodies which consist of a material which can be machined using the chemical mechanical double-side polishing process employed. Examples of such materials include silicon, silicon/germanium and so-called III-V semiconductors, such as gallium arsenide. The process is particularly suitable for the production of single crystal silicon wafers with diameters of in particular 200 mm, 300 mm, 400 mm and 450 mm and thicknesses from a few 100 $\mu$m to a few cm, preferably from 400 $\mu$m to 1200 $\mu$m. The semiconductor wafers may either be used immediately as starting material for the production of semiconductor components or may be supplied for their intended purpose after a final polishing step according to the prior art has been carried out and/or after layers, such as back-side seals or an epitaxial coating on the wafer front side, for example with silicon, have been applied and/or after a heat treatment, for example under a hydrogen or argon atmosphere. In addition to the production of wafers from a homogenous material, the invention may, of course, also be used to produce semiconductor substrates with a multilayer structure, such as SOI wafers (silicon-on insulator wafers).

The process is described further on the basis of the example of the production of a multiplicity of silicon wafers.

In principle, it is possible for a multiplicity of silicon wafers which have been sawn, for example by an annular sawing or wire sawing method and whose areas close to the surface, depending on the diameter and the type of sawing process, have a damaged crystalline structure down to a depth in the range of 10 to 40 $\mu$m, to be subjected directly to the novel process sequence of double-side polishing (a), quality assessment (b), flash DSP polishing of the reject wafers (c), and further quality assessment of the wafers (d) polished in (c). However, it is sensible, and therefore preferable, for the sharply delimited, and therefore very mechanically sensitive, edges of the wafers to be rounded with the aid of suitably profiled grinding wheels. Suitable grinding wheels consist of metal-bonded diamonds or resin-bonded diamonds. To provide an edge with little damage while reducing the machining times and therefore the costs of the edge-rounding step, it is customary according to the prior art, and therefore preferable within the context of the invention, to use a two-stage process firstly involving a grinding wheel with a relatively coarse diamond grain. This is followed by a grinding wheel with diamonds of a relatively fine grain. In the first step, it is particularly preferable to employ a metal-bonded grinding wheel with diamonds with a 400 mesh grain (grain size range 30–50 $\mu$m) to 600 mesh (grain size range 20–30 $\mu$m). In the second step it is particularly preferable to use a grinding wheel of similar structure with diamonds with a grain of 1000 mesh (grain size range 8–15 $\mu$m) to 1500 mesh (grain size range 5–10 $\mu$m) in case the further process sequence also involves an etching step with the removal of destroyed crystal layers being carried out from the edge of the wafer.

In the examples which follow later in the description, this procedure is referred to as "coarse edge rounding". If there is no etching step in the further process sequence, it is particularly preferable to use a two-stage process for edge rounding in which in the first step a metal-bonded grinding wheel with diamonds with a grain of 400 mesh (grain size range 30–50 $\mu$m) to 600 mesh (grain size range 20–30 $\mu$m) is used. In the second step a resin-bonded grinding wheel with diamonds with a grain of 1200 mesh (grain size range 7–12 $\mu$m) to 2000 mesh (grain size range 4–6 $\mu$m) is used. In the examples which follow later in the description, this procedure is referred to as "fine edge rounding". Alternative techniques for fine edge rounding which have by now become established on the market, for example the combination of conventional edge rounding with a mechanical polishing part, are also suitable if there is no etching step carried out.

To improve the geometry and abrade some of the disrupted crystal layers, it is possible for the silicon wafer to be subjected to a mechanical abrasion step, such as lapping or grinding, in order to reduce the amount of material which has to be removed in the double-side polishing step (a). It is preferable for the silicon wafer to be subjected to a surface grinding step, in which either one side is ground or both sides are ground sequentially or both sides are ground simultaneously. Sequential surface grinding of the front and back sides of the wafers is particularly preferred. To remove the damage to the wafer surface and edge which inevitably results from the mechanical process steps and to remove any impurities which are present, for example metallic impurities bonded in the damage, it is possible for an etching step to follow at this point. This etching step may be carried out either as a wet chemical treatment of the silicon wafer in an alkaline or acid etching mixture or as a plasma treatment. An acid etching step in a mixture of concentrated aqueous nitric acid and concentrated aqueous hydrofluoric acid in accordance with the embodiment claimed in DE 198 33 257 C1 is preferred.

A preferred starting material for the process according to the invention is a multiplicity of semiconductor wafers made from silicon, produced by sawing of a single silicon crystal, followed by fine edge rounding. Another preferred starting material is a multiplicity of semiconductor wafers made from silicon produced by sawing of a single silicon crystal followed by fine edge rounding and sequential surface grinding. Another preferred starting material is a multiplicity of semiconductor wafers made from silicon, produced by sawing of a single silicon crystal followed by coarse edge rounding and wet chemical etching. A particularly preferred starting material is a multiplicity of semiconductor wafers made from silicon with a diameter of greater than or equal to 200 mm, produced by wire sawing of a single silicon crystal, followed by coarse edge rounding, sequential surface grinding of both sides of the wafers, so that from 10 $\mu$m to 100 $\mu$m of silicon is abraded on each side, and wet chemical etching in an acid etching mixture with from 5 $\mu$m to 50 $\mu$m of silicon being removed from each side of the wafers.

Steps (a) to (d) of the invention for inexpensively converting the starting material into a multiplicity of double-side polished silicon wafers which satisfy the demands imposed on semiconductor wafers to be used as starting material for semiconductor component processes with line widths of less than or equal to 0.13 $\mu$m are described in more detail below.

Double-side polishing step (a)

A commercially available double-side polishing machine of suitable size can be used to carry out the polishing step (a) according to the invention. For cost reasons it is sensible to polish a multiplicity of silicon wafers simultaneously. The polishing machine substantially comprises a bottom polishing plate which can rotate freely in the horizontal direction and a top polishing plate which can rotate freely in the horizontal direction. Both of these plates are covered with in each case one polishing cloth, and the machine allows semiconductor wafers, in this case silicon wafers, to be polished so that material is abraded on both sides, with a polishing fluid of suitable chemical composition being supplied continuously. It is particularly preferable for the polishing to use a commercially available polyurethane polishing cloth with a hardness of 60 to 90 (Shore A), with continuous supply of a polishing fluid with a pH of from 10 to 11, comprising 1 to 5% by weight $SiO_2$ in water, under a polishing pressure of from 0.1 to 0.3 bar.

The silicon wafers are held on a geometric path which is defined by machine and process parameters by carriers which have cutouts of sufficient dimensions to hold the silicon wafers. The carriers are in contact with the polishing machine, for example by means of a pin gearing or involute toothing, via a rotating inner pinned or toothed ring and an outer pinned or toothed ring which generally rotates in the opposite direction. As a result the carriers are set in rotating motion between the two polishing plates. In principle, the carriers may be made, for example, from metal, plastics, fiber-reinforced plastics or plastic-coated metal. Carriers made from steel or from fiber-reinforced plastics are preferable. On account of their high dimensional accuracy and chemical stability, carriers made from stainless chromium steel are particularly preferable. To prevent the edge of the wafers from being damaged by the inner edge of the cutout in the carrier during polishing, it is sensible and therefore preferable for the inside of the cutout to be lined with a plastic coating of the same thickness as the carrier, as described in EP 208 315 B1. Suitable plastics are in this case, for example, polyamide, polyethylene, polypropylene, polyvinyl chloride, polytetrafluoroethylene or polyvinylidene difluoride, which are all equally preferable.

The carriers for the step (a) according to the invention have a preferred thickness $t_{1L}$ of from 400 to 1200 $\mu$m. In order to have silicon wafers with a high local flatness after step (a), it is particularly preferable to use a double-side polishing process in which the selected thickness of the carriers $t_{1L}$ is close to the desired final thickness $t_1$ of the silicon wafers after step (a). This desired final thickness ultimately is dependent on the diameter of the silicon wafers and on the planned application. A polishing process of this nature is described in DE 199 05 737 A1. A characteristic feature of this design variant is that the starting thickness $t_0$ of the silicon wafers to be polished is particularly preferably 30 to 70 $\mu$m greater than the carrier thickness $t_{1L}$, and the final thickness of the polished wafers $t_1$ is particularly preferably 5 to 15 mm greater than the carrier thickness $t_{1L}$. It is particularly preferable for the amount of silicon removed $t_0-t_1$ to be between 20 $\mu$m and 50 $\mu$m.

Within the context of the comments made with regard to these particularly preferred thickness ratios, the polishing time required to achieve a predetermined removal of silicon is of considerable importance. The polishing time (in min) is determined by dividing the difference between the starting thickness $t_0$ (in $\mu$m) and the target thickness $t_1$ (in $\mu$m) of the silicon wafers by the stock removal rate of the polishing machine (in $\mu$m/min). The permissible target thickness $t_1$ is determined by the specification window stipulated by the further processor of the wafers, usually target thickness $t_T\pm15$ $\mu$m or $t_T\pm25$ $\mu$m, and the current thickness $t_{1L}$ of the carriers used, the difference $t_1-t_{1L}$ particularly preferably being between 5 $\mu$m and 15 $\mu$m. The carriers made from stainless chromium steel which are particularly preferable to use can be produced with a very accurate thickness, for example by employing lapping or grinding processes. However, if the particularly preferred polishing parameters are selected, the carriers become slightly, although homogeneously, worn during prolonged operating periods. To determine the polishing times as accurately as possible, therefore, the carrier thickness $t_{1L}$ should be determined periodically, for example with the aid of calipers or a micrometer screw. If the thickness of the carriers $t_{1L}$, as a result of a certain period of use, has fallen below a defined action limit, for example $t_T-10$ $\mu$m or $t_T-15$ $\mu$m, these carriers can be used without problems to carry out step (c), which is described further below, of the process sequence according to the invention.

After the end of polishing (a), if appropriate adhering polishing fluid is cleaned off the silicon wafers and the wafers are dried.

Assessment step (b)

There follows an assessment of the multiplicity of silicon wafers with regard to quality features which are influenced by the double-side polishing step (a) and have been specified by the further processor of the wafers, using methods which are known to the person skilled in the art. Features of this nature may, for example, be local geometry data and wafer thickness $t_1$. These data are determined using a commercially available measuring instrument which operates on a capacitive or optical principle. The data are advantageously electronically stored in a database and are available for the statistical process control (SPC) which is desirable in production mode. It is also possible and advantageous to produce a data technology link between measuring instrument and polishing machine via a master computer. In this way it is possible, for example during consecutive polishing runs with wafer material of the same type, by specifying starting thickness $t_0$ and target thickness $t_1$, to automatically predetermine the polishing time for the subsequent polishing run by calculating the current abrasion rate.

Other quality features assessed in step (b) may include properties which affect the front side, the back side, and/or the edge of the wafers. In this context, it is very important to assess the occurrence and extent of scratches, stains, light point defects and other deviations from the ideal silicon surface, such as for example damage caused by prior mechanical processes which has not been eliminated by polishing. An assessment of this nature is in practice usually carried out visually by trained personnel under strongly focused light, so-called haze light. Alternatively, or in addition, it is also possible for the wafers to be assessed using technical accessories, such as for example a microscope or a laser detection unit.

Those silicon wafers from the multiplicity of silicon wafers assessed which satisfy the quality demands imposed are temporarily stored, for example in a stocker as described in EP 866 497 A2, or are fed directly for their further intended use. Those silicon wafers from the multiplicity of silicon wafers assessed which do not satisfy the quality demands imposed are separated out and in one embodiment are fed directly for further machining in accordance with step (c). However, they may also be collected for a certain period and then fed to step (c).

Flash DSP step (c)

The silicon wafers of thickness $t_1$ which have been separated out in step (b) are now fed to a further double-side polishing step. This step leads to wafers of a thickness $t_2$ and, with particularly preferred amounts of removed silicon $t_1 - t_2$ of between 2 μm and 10 μm, removes considerably less material than step (a). Step (a) particularly preferably involves amounts of removed silicon $t_0 - t_1$ of between 20 μm and 50 μm. Therefore, step (c), unlike the double-side polishing step (a), can be referred to as a flash DSP process. The basic execution of step (c) can take place without problems as described under step (a). The carrier thickness $t_{2L}$ of the carriers used in step (c) may be considerably less, for example 20 μm to 200 μm less, than the starting thickness of the wafers $t_1$. However, with a view to achieving optimum local geometry results, it has proven advantageous for the flash DSP to involve the use of carriers within a defined thickness window in which the thickness difference $t_1 - t_{2L}$ is between 5 μm and 30 μm. Also the thickness difference $t_2 - t_{2L}$ is between 2 μm and 10 μm; this procedure is therefore particularly preferable.

With regard to the size of double-side polishing machine, there are in principle no restrictions for the flash DSP process (c). Step (c) may be carried out either on the same polishing machine as step (a) or on a polishing machine of the same design or on a polishing machine which simultaneously double-side polishes more or fewer semiconductor wafers than that used for step (a). In view of the object of the invention to provide a process for producing a multiplicity of semiconductor wafers which is improved in terms of the production costs, it may be sensible to use a polishing machine for machining single wafers or for machining only a few wafers, for example 3 to 5 wafers, per polishing run. However, it is equally possible without problems, and even, under certain circumstances, advantageous in terms of costs, to use a polishing machine which allows the simultaneous polishing of a larger number of wafers, for example from 15 to 30 wafers. If the total number of wafers provided for flash DSP is not a multiple of the number of wafers which would completely occupy the machine, the number of carriers used can be reduced accordingly. However, it is more sensible, with a view to optimizing the running of a double-side polishing machine of this type, and therefore preferable, for the corresponding polishing run to be filled up. Thus the carriers are fully occupied, with further similar wafers that are of the starting thickness $t_1$ but are not included in the multiplicity of semiconductor wafers, i.e. with so-called dummy wafers.

After the end of the flash DSP process (c), adhering polishing fluid is once again cleaned off the silicon wafers and the wafers are dried.

Assessment step (d)

After they have passed through step (c), the wafers involved are fed for further assessment in accordance with step (b). In this assessment, it is found that, depending on the gravity of the flaws which lead to the flash DSP step being carried out, on average between 70% and 95% of the wafers now satisfy the quality criteria demanded. This produces the result that the total yield of the process sequence (a)–(b)–(c)–(d) according to the invention is significantly increased. For example, it was found that silicon wafers which according to geometry measurement carried out in step (b) had local flatness values $SFQR_{max}$ of less than or equal to 0.13 μm still satisfy this criterion. On the other hand, a high percentage of wafers which were produced by a shortened process sequence, for example sawing—edge rounding—double-side polishing step (a) or sawing—edge rounding—etching—double-side polishing step (a) and were separated out during the geometry measurement, now satisfy the required quality of $SFQR_{max}$ less than or equal to 0.13 μm. Equally, many wafers which did not successfully pass step (b) on account of scratches, stains, light point defects and further surface flaws, now satisfy the demands imposed in order for them to be processed further. As a result of the particularly preferred amounts of silicon removed $t_1 - t_2$ in step (c) of between 2 μm and 10 μm, the thickness of the wafers fed to steps (c) and (d) differs from the wafers which have been temporarily stored or passed onwards after steps (a) and (b) only by this amount. Step (c) is carried out in such a manner that $t_2$ lies within the thickness window which is intended for further use. Depending on the particular requirements, the wafers which have passed through steps (a) to (d) can be combined with those wafers which have only passed through steps (a) and (b) in batches or in a manner appropriate for the wafers, to form a multiplicity of semiconductor wafers according to the invention.

Depending on their intended further purpose, it may be necessary for the front side of each of the multiplicity of silicon wafers produced using the process according to the invention to undergo final polishing in accordance with the prior art, for example using a soft polishing cloth with the aid of an alkaline polishing fluid based on $SiO_2$. To obtain the very low, uniformly distributed local geometry values, the amount of silicon abraded from each wafer in this step should be relatively small, lying, for example, between 0.1 and 0.7 μm.

If necessary, a heat treatment of the multiplicity of semiconductor wafers can be introduced at any desired point in the process sequence. For example neat treatment is useful in order to eliminate thermal donors, to anneal out any disturbance in crystal layers close to the surface, or to bring about controlled reduction of the dopant levels in the aforementioned layers. Furthermore, laser writing in order to identify the wafers and/or an edge polishing step may be inserted at any suitable point in the process sequence, for example before or after grinding in the case of the laser marking, and before, during or after the double-side polishing step (a) in the case of the edge polishing. A series of further process steps which are required for certain products, such as for example the application of back side coatings of polysilicon, silicon dioxide or silicon nitride, or the application of an epitaxial layer of silicon or other semiconducting materials to the front side of the silicon wafers can also be included at suitable points in the process sequence using processes which are known to the person skilled in the art. Furthermore, it may also be desirable for the semiconductor wafers to undergo batch or individual wafer cleaning according to the prior art before or after individual process steps.

Semiconductor wafers, in particular silicon wafers, produced according to the invention fulfill the demands imposed on the production of semiconductor components with line widths of less than or equal to 0.13 μm. The process according to the invention has proven to be an optimum solution for reducing the production costs of silicon wafers having the features which have been outlined. It is surprising and unexpected that machining double-side polished wafers which do not satisfy the quality features stipulated for further processing, such as the extent of scratches, stains and light point defects, by means of a flash DSP process with only from 2 μm to 10 μm of material being removed is successful in high yields without the local flatness of the wafers being adversely affected. In fact, the opposite is the case: the positive influence of the flash DSP step (c) on the local geometry values means that it is even possible to impose lower geometry demands on the starting product or on the product of the double-side polishing step (a) in the sequence according to the invention. This opens up the possibility of further decrease in the production costs by reducing the amount of material abraded or eliminating process steps such as grinding or etching.

BRIEF DESCRIPTION OF THE DRAWINGS

Other objects and features of the present invention will become apparent from the following detailed description considered in connection with the accompanying drawings which disclose several embodiments of the present invention. It should be understood, however, that the drawings are designed for the purpose of illustration only and not as a definition of the limits of the invention.

In the drawings, wherein similar reference characters denote similar elements throughout the several views.

DETAILED DESCRIPTION OF PREFERRED EMBODIMENTS

All the comparative examples and examples (invention) described below relate to the production of silicon wafers doped with small amounts of boron and having a diameter of 300 mm. In the first process steps, which were carried out identically for all the comparative examples and examples (invention), single crystals were grown according to the prior art, cut to length and cylindrically ground. The single crystals were divided into wafers on a commercially available wire saw. The selected thickness of the silicon wafers was dimensioned as a function of the planned amounts of material to be abraded during the further process, in such a way that a final thickness of the fully processed wafers of (775±10) μm was achieved.

Comparative Example 1

In this comparative example, the procedure was as described in a preferred embodiment of DE 199 05 737 A1. Wire-sawed silicon wafers with a thickness of 895 μm were produced and, in a two-stage process, underwent coarse edge rounding. The first step used a grinding wheel with metal-bonded diamonds with a grain of 600 mesh (grain size range 20–30 μm). The second step involved the use of a grinding wheel of similar structure with diamonds with a grain of 1200 mesh (grain size range 7–12 μm). Then, a surface grinding step using diamonds with a grain of 600 mesh (grain size range 20–30 μm) was carried out on a rotary grinding machine, 30 μm of silicon being abraded successively from both the front and back sides of the wafers. This was followed by an acid etching step using the flow etching process. 10 μm of silicon each was removed at the same time from each side of the wafer as a result of the rotating wafers being immersed in a mixture which was at a temperature of 20° C. This mixture comprised 90% by weight concentrated nitric acid (70% by weight in aqueous solution), 10% by weight concentrated hydrofluoric acid (50% by weight in aqueous solution) and 0.1% by weight ammonium lauryl sulfate. After the etching step, the thickness of the silicon wafers was 815 μm.

Five carriers made from stainless chromium steel with a thickness of 770 μm were available for the double-side polishing step. These carriers each had three circular, polyamide-lined cutouts with an internal diameter of 301 mm arranged at regular intervals over a circular path. This allowed for simultaneously polishing of 15 300-mm silicon wafers on a double-side polishing machine of type AC2000 produced by Peter Wolters. The double-side polishing step was carried out using a commercially available polyurethane polishing cloth reinforced by polythene fibers, marketed as SUBA 500 by Rodel, in each case stuck to the top and bottom polishing plates. Also used was a polishing fluid of the type Levasil 200 produced by Bayer, with a solid $SiO_2$ content of 3% by weight and a pH set at 10.5 through the addition of potassium carbonate and potassium hydroxide, under a pressure of 0.15 bar. The polishing took place with the top and bottom polishing plate at a temperature of in each case 40° C. and led to an abrasion rate of 0.60 μm/min. In 50 polishing runs, a total of 750 silicon wafers were polished until their thickness after polishing was 775 μm, corresponding to a stock removal of 40 μm. The total amount of material removed by the machining of the wafers was therefore 120 μm.

After the polishing had ended, adhering polishing fluid was cleaned off the silicon wafers. The wafers were dried and were measured with regard to their local geometry on a commercially available geometry gauge which operates on the capacitive principle, with a 3 mm edge exclusion. All the wafers satisfied the geometry requirement imposed on silicon wafers for 0.13-μm component technology. Hence the local flatness measurement $SFQR_{max}$ for a surface grid of 25 mm×25 mm corresponded to values of less than or equal to 0.13 m. Then, the front side, back side and edge of all 750 wafers was inspected visually. Under this inspection, 24 wafers did not satisfy the requirements imposed for further processing on account of scratches, eleven wafers failed to do so on account of stains, and five wafers failed to do so on account of light point defects, and all these wafers were discarded. The yield was 94.7%.

Figure 1:
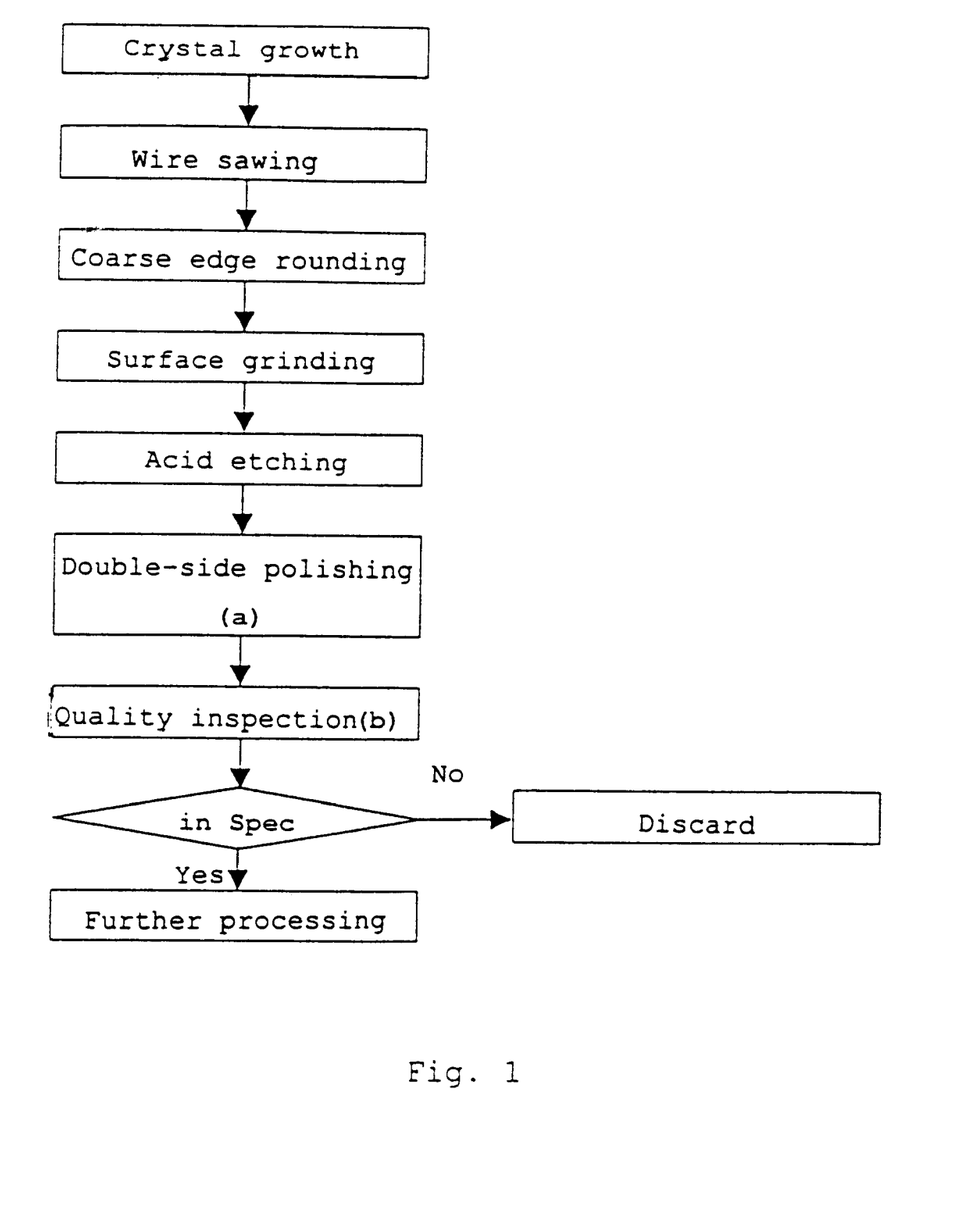
FIG. 1 shows the process sequence for the production of a multiplicity of double-side polished semiconductor wafers made from silicon in accordance with Comparative Examples 1 and 2.

FIG. 1 shows the process sequence for the production of a multiplicity of double-side polished semiconductor wafers made from silicon in accordance with Comparative Example 1.

Figure 5:
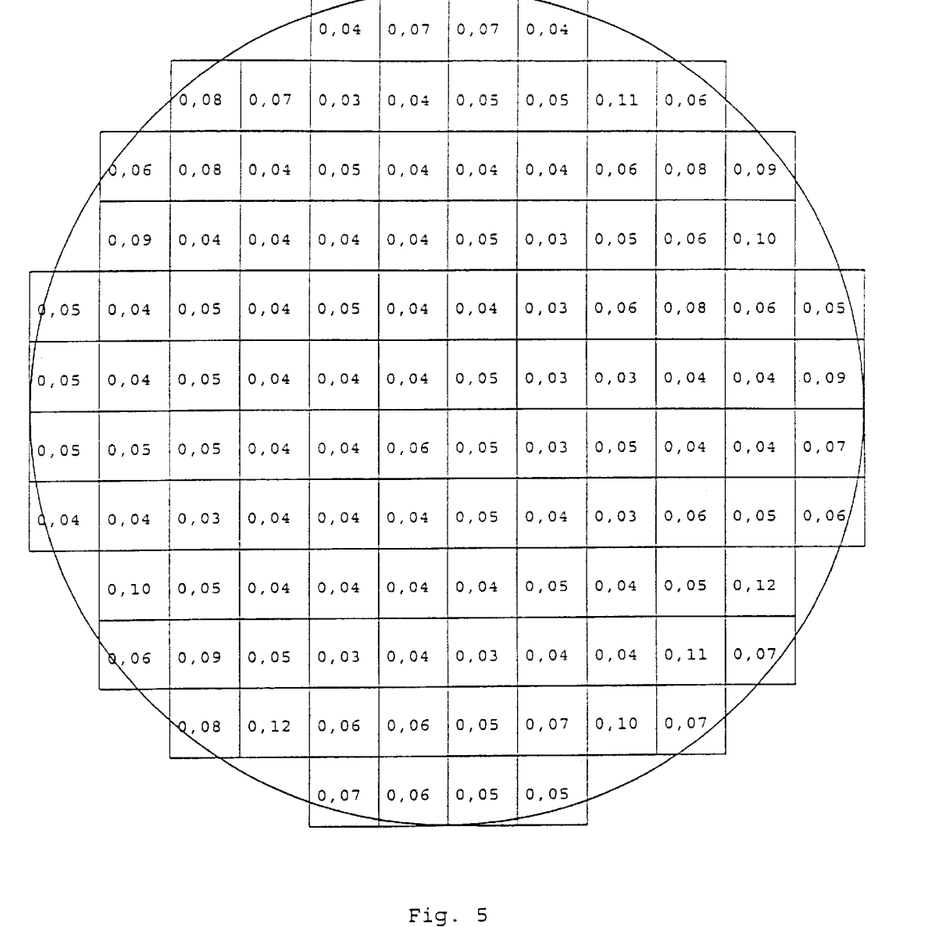
FIG. 5 shows the distribution of the local flatness values SFQR for partial areas (112 surface elements) of size 25 mm×25 mm, which are arranged to cover the area, of a double-side polished silicon wafer which has been produced in accordance with Comparative Example 1 and has a diameter of 300 mm.

FIG. 5 shows the distribution of the local flatness values SFQR for partial areas (112 surface elements) of size 25 mm×25 mm, which are arranged to cover the area, of a double-side polished silicon wafer which has been produced in accordance with Comparative Example 1 and has a diameter of 300 mm.

EXAMPLE 1

The procedure was initially as described in Comparative Example 1. All 750 double-side polished silicon wafers produced in this example once again satisfied the geometry requirement of $SFQR_{max}$ less than or equal to 0.13 µm. During the visual inspection, 22 wafers failed to satisfy the demands imposed for further processing on account of scratches, 15 wafers failed to so on account of stains, and eight wafers failed to so on account of light point defects, corresponding to a yield of 93.6%. These 45 reject wafers with a thickness of 775 µm were polished using a flash DSP process in three polishing runs each involving 15 wafers, using the following parameters. The carriers used in this case had a thickness of 765 µm, and the final thickness after the flash DSP was 770 um, corresponding to an abrasion of an additional 5 µm. The further process corresponded to that carried out during the first DSP step. Further measurement of the geometry likewise did not lead to rejection of any wafers. Further visual inspection of the surface under strongly focused light revealed that 41 wafers fulfilled the demands imposed for further processing; four wafers were discarded because of flaws. As a result, the total yield rose to 99.5%.

Figure 2:
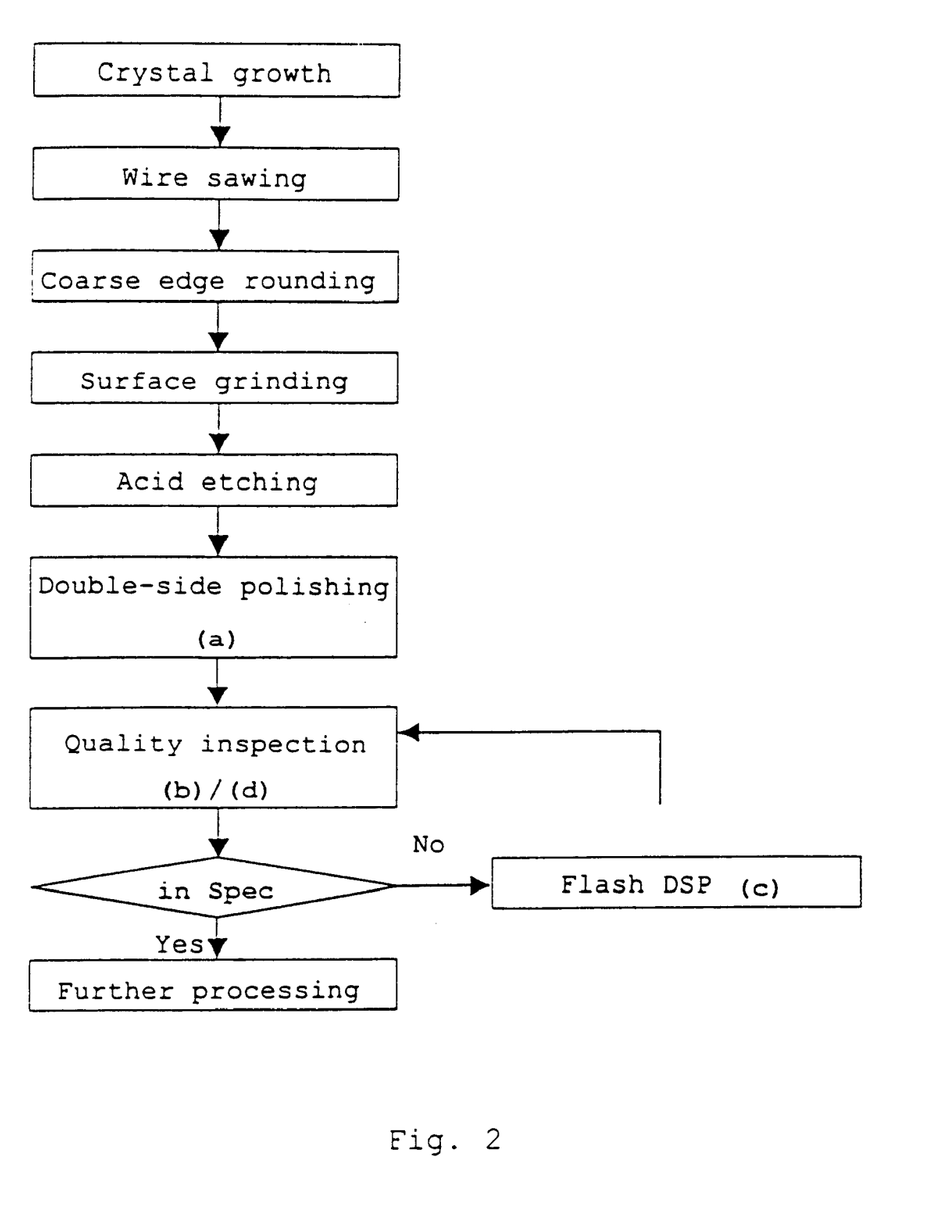
FIG. 2 shows the process sequence for the production of a multiplicity of double-side polished semiconductor wafers made from silicon in accordance with Examples 1 and 2.

FIG. 2 shows the process sequence for the production of a multiplicity of double-side polished semiconductor wafers made from silIcon in accordance with Example 1.

Figure 6:
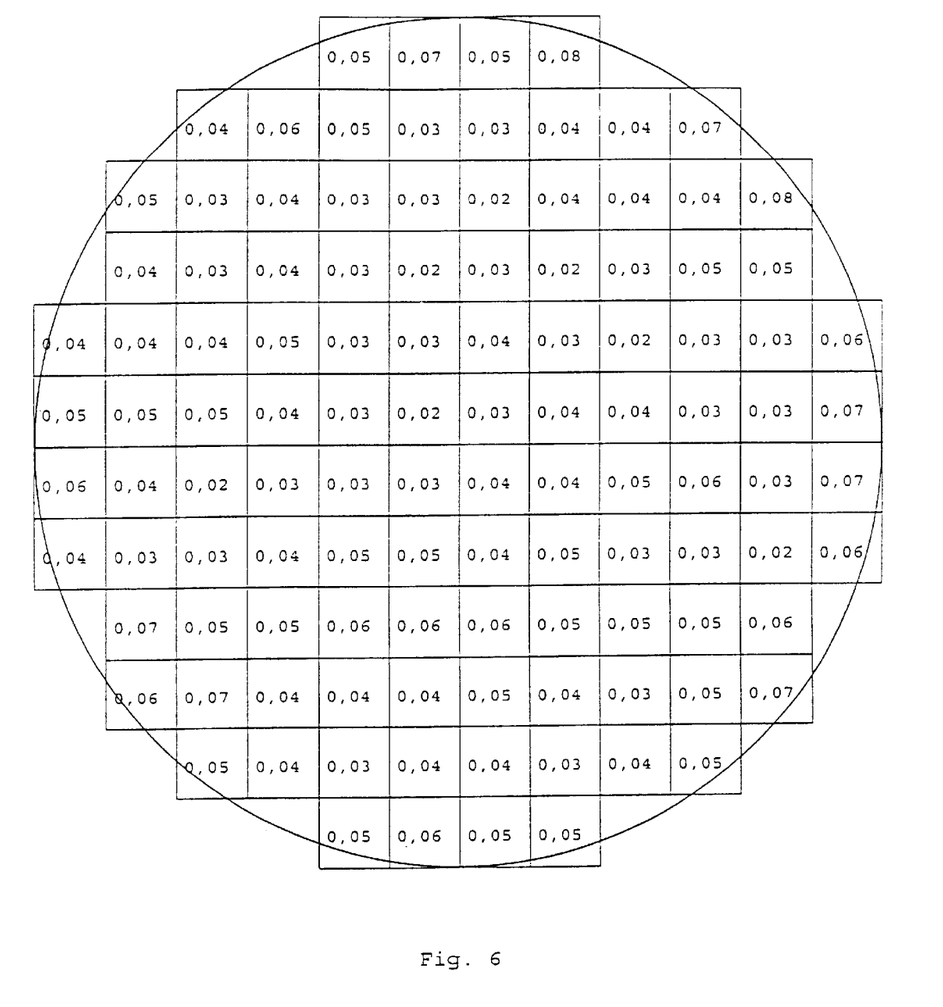
FIG. 6 shows the distribution of the local flatness values SFQR for partial areas (112 surface elements) of the size 25 mm×25 mm, which are arranged to cover the surface, of one of those double-side polished silicon wafers which have been produced in accordance with Example 1 and have a diameter of 300 mm and have been subjected to flash DSP machining in accordance with step (c).

FIG. 6 shows the distribution of the local flatness values SFQR for partial areas (112 surface elements) of the size 25 mm×25 mm, which are arranged to cover the surface, of one of those double-side polished silicon wafers which have been produced in accordance with Example 1 and have a diameter of 300 mm and have been subjected to flash DSP machining in accordance with Example 1 and have a diameter of 300 mm and have been subjected to flash DSP machining in accordance with step (c).

Comparative Example 2

The procedure was as in Example 1, with two differences. Firstly the amount of silicon removed in the surface-grinding step was reduced to 50 µm (25 µm from each side of the wafers), and secondly the amount of silicon removed during the double-side polishing was reduced to 20 µm. The total amount of material removed by the machining of the wafers was therefore 90 µm. All the wafers fulfilled the geometry requirement of $SFQR_{max}$ less than or equal to 0.13 µm. The yield during the visual inspection was 88.2%; the main reasons for rejection were scratches and light point defects.

FIG. 1 shows the process sequence for the production of a multiplicity of double-side polished semiconductor wafers made from silicon in accordance with Comparative Example 2.

EXAMPLE 2

The reject wafers from Comparative Example 2 underwent flash DSP as described in Example 1. Since the number of wafers requiring further polishing was not divisible by 15, the final polishing run was filled up with dummy wafers made from silicon with a thickness of 775 µm in order that the polishing machine should be fully occupied. Including the wafers which were converted to a quality satisfying specifications by the flash DSP, the total yield rose to 98.1%.

FIG. 2 shows the process sequence for the production of a multiplicity of double-side polished semiconductor wafers made from silicon in accordance with Example 2.

Comparative Example 3

The procedure was as described in Comparative Example 1, except that the surface grinding step was dispensed with altogether, with the result that the total amount of material removed by the machining of the wafers fell to 60 µm. 9.8% of the wafers failed to fulfil the geometry requirement of $SFQR_{max}$ less than or equal to 0.13 µm. During the visual inspection, 4.7% of the wafers were failed, with scratches being the principal cause of rejection. The yield was therefore 85.5%.

EXAMPLE 3

The reject wafers from Comparative Example 3 underwent flash DSP as described in the preceding examples. Including the wafers which were converted into a quality which complies with the specification by flash DSP, the total yield rose to 96.2%.

Comparative Example 4

The procedure was as in Comparative Example 1, with the following three differences: the second step of the edge rounding process was carried out as fine edge rounding, using a resin-bonded grinding wheel with diamonds with a grain of 1500 mesh (grain size range 5–10 µm). The etching step was dispensed with altogether. 30 µm of silicon were removed in the double-side polishing step. Therefore, the total amount of material removed by the machining of the wafers was 90 µm. All the wafers fulfilled the geometry requirement of $SFQR_{max}$ less than or equal to 0.13 µm. The yield during the visual inspection was 87.6%. The principal reasons for rejection were scratches and also surface areas in which damage from the grinding process had not been eliminated by polishing.

EXAMPLE 4

The reject wafers from Comparative Example 4 underwent flash DSP as described in the previous examples. Including the wafers which were converted into a quality which complies with the specification by flash DSP, the total yield rose to 97.5%.

Comparative Example 5

The procedure was as described in Comparative Example 1, with the following four differences: the second step of the edge rounding process was carried out as fine edge rounding, as described in Comparative Example 4. The surface-grinding step was eliminated altogether. The etching step was likewise eliminated altogether. In the double-side polishing step, 50 μm of silicon was removed. The selected process sequence therefore corresponded to an embodiment described in EP 754 785 A1. The total amount of material abraded by the machining of the wafers was reduced to the following Table 1 shows the process sequence, the amounts of material removed, the yield of wafers which were in spec and the relative production costs for each wafer, based on the production costs of the wafers produced in accordance with Comparative Example 1, for Comparative Examples 1 to 5 (C1 to C5) and Examples 1 to 5 (E1 to E5), (Invention).

TABLE 1

|  | C1 | E1 | C2 | E2 | C3 | E3 | C4 | E4 | C5 | E5 |
| --- | --- | --- | --- | --- | --- | --- | --- | --- | --- | --- |
| Crystal growth | ✓ | ✓ | ✓ | ✓ | ✓ | ✓ | ✓ | ✓ | ✓ | ✓ |
| Wire sawing | ✓ | ✓ | ✓ | ✓ | ✓ | ✓ | ✓ | ✓ | ✓ | ✓ |
| Coarse edge rounding | ✓ | ✓ | ✓ | ✓ | ✓ | ✓ |  |  |  |  |
| Fine edge rounding |  |  |  |  |  |  | ✓ | ✓ | ✓ | ✓ |
| Grinding | 60 μm | 60 μm | 50 μm | 50 μm |  |  | 60 μm | 60 μm |  |  |
| Acid etching | 20 μm | 20 μm | 20 μm | 20 μm | 20 μm | 20 μm |  |  |  |  |
| Double-side pol. | 40 μm | 40 μm | 20 μm | 20 μm | 40 μm | 40 μm | 30 μm | 30 μm | 50 μm | 50 μm |
| Tot. removal | 120 μm | 120 μm | 90 μm | 90 μm | 60 μm | 60 μm | 90 μm | 90 μm | 50 μm | 50 μm |
| Characteriz. | ✓ | ✓ | ✓ | ✓ | ✓ | ✓ | ✓ | ✓ | ✓ | ✓ |
| 1st yield | 94.7% | 93.6% | 88.2% | 88.2% | 85.5% | 85.5% | 87.6% | 87.6% | 79.9% | 79.9% |
| Flash DSP* |  | ✓ |  | ✓ |  | ✓ |  | ✓ |  | ✓ |
| Characteriz. |  | ✓ |  | ✓ |  | ✓ |  | ✓ |  | ✓ |
| Tot. yield | 94.7% | 99.5% | 88.2% | 98.1% | 85.5% | 96.2% | 87.6% | 97.5% | 79.9% | 98.1% |
| Production costs/wafer | 100.0 | 95.9 | 97.3 | 89.4 | 100.8 | 92.2 | 101.2 | 93.0 | 109.3 | 93.9 |

*machining of the reject wafers

50 μm of silicon removed by the double-side polishing. 8.6% of the wafers failed to satisfy the geometry requirement of $SFQR_{max}$ less than or equal to 0.13 μm. During the visual inspection, 11.5% of the wafers were failed, with scratches and damage from the wire sawing process which had not been eliminated by polishing being the principal causes of rejection. The yield was therefore 79.9%.

Figure 3:
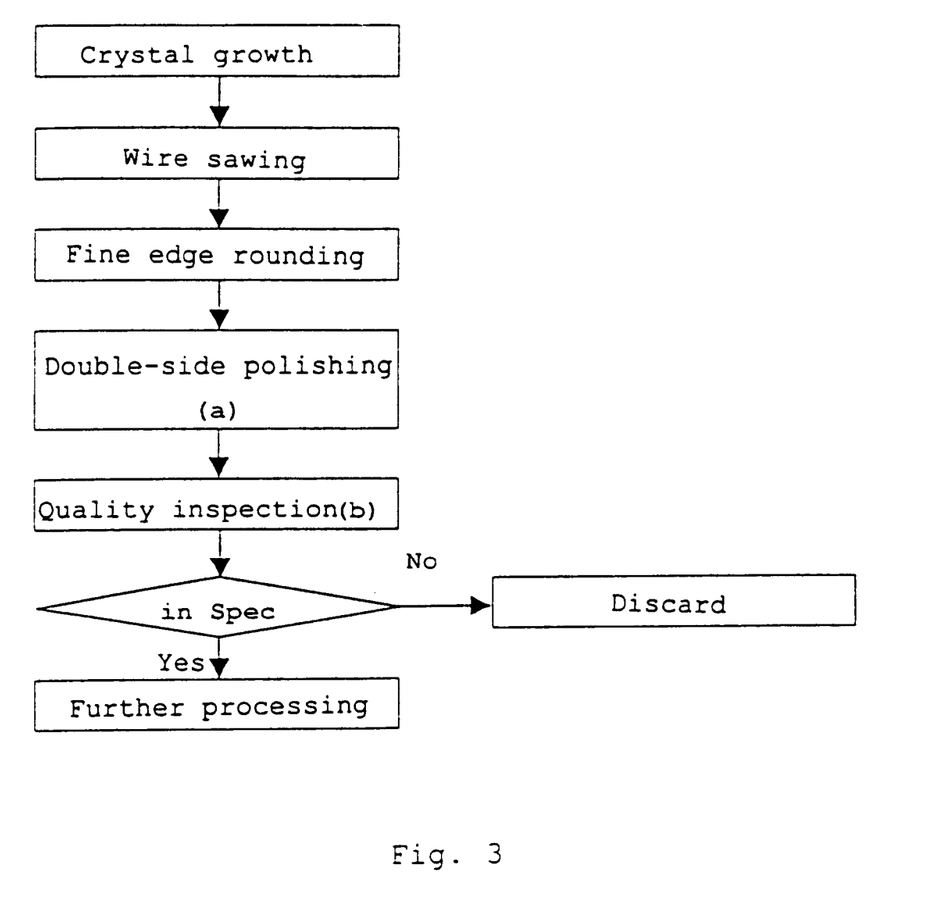
FIG. 3 shows the process sequence for the production of a multiplicity of double-side polished semiconductor wafers made from silicon in accordance with Comparative Example 5.

FIG. 3 shows the process sequence for the production of a multiplicity of double-side polished semiconductor wafers made from silicon in accordance with Comparative Example 5.

EXAMPLE 5

The reject wafers from Comparative Example 5 underwent a flash DSP as described in the previous examples. Including the wafers which were converted into a quality which complies with the specification by the flash DSP, the total yield rose to 98.1%.

Figure 4:
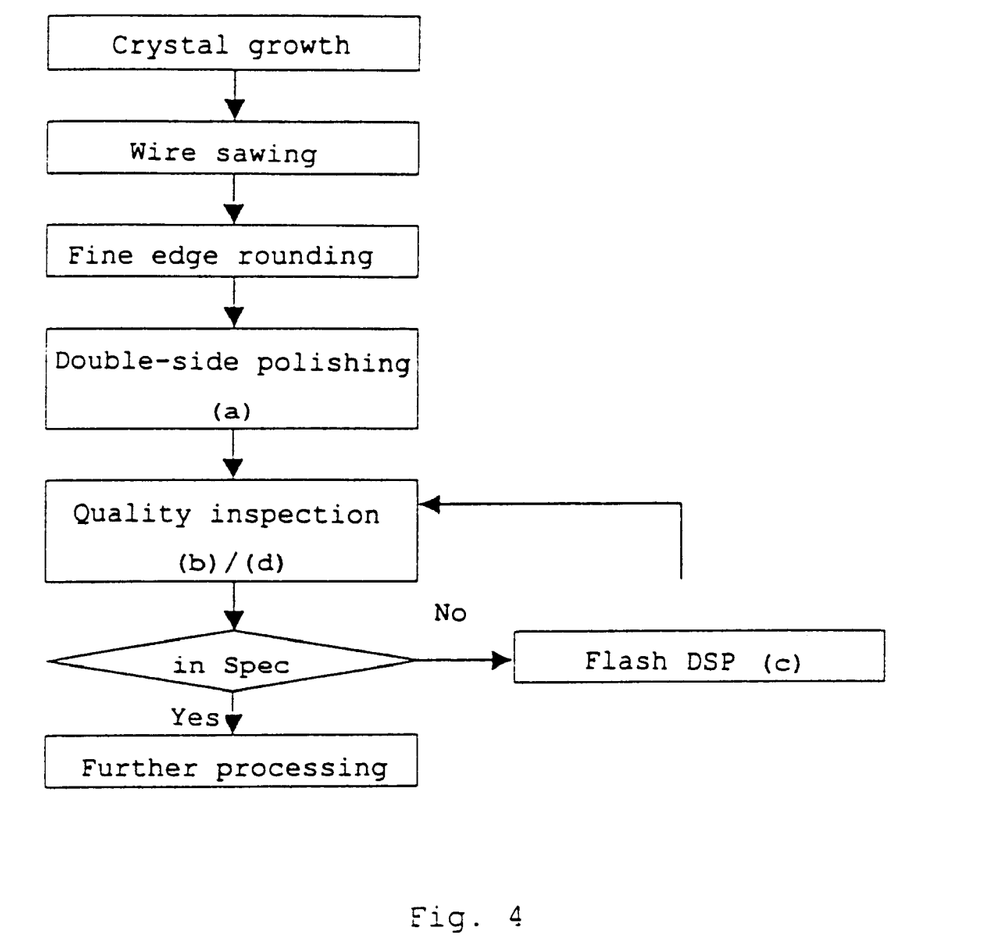
FIG. 4 shows the process sequence for the production of a multiplicity of double-side polished semiconductor wafers made from silicon in accordance with Example 5.

FIG. 4 shows the process sequence for the production of a multiplicity of double-side polished semiconductor wafers made from silicon in accordance with Example 5.

Production Costs for the Silicon Wafers Produced in Comparative Examples 1 to 5 and Examples 1 to 5

The production costs for the wafers produced according to the Comparative Examples and Examples (Invention) listed above were determined using one of the standard cost calculation methods, with the extra costs caused by the lost yields being taken into account. In addition, differences between the individual variant embodiments resulted from the selection of the edge rounding process (the less expensive coarse rounding was used on wafers to be etched, while the more expensive fine rounding was used on wafers which were intended for the process sequences without an etching step). Differences also resulted from the variations in the amount of material removed in the grinding, etching and double-side polishing steps. The costs of the flash DSP carried out in the examples was also taken into account. The

EXAMPLE 6

In ongoing production of 300 mm silicon wafers using the procedure described in Comparative Example 1, technical problems arose with supplying the polishing fluid to the double-side polishing machine while the double-side polishing step (a) was being carried out. The problem was eliminated, but the visual inspection (b) revealed that the front and back sides of a total of 45 wafers from three polishing runs affected by the fault had been scratched, and therefore these wafers did not satisfy the quality requirements. These reject wafers underwent flash DSP (c) as described in the previous examples. Further visual inspection (d) of the wafers which had been machined in accordance with (c) established that 39 of these wafers fulfilled the requirements for further processing.

EXAMPLE 7

In this case, the customer requested 300 mm silicon wafers with a polished edge. Initially, the procedure was as described in Comparative Example 1, carrying out a double-side polishing step (a), except that an edge-polishing step carried out on a commercially available automated edge-polishing unit was added between geometry measurement (b1) and final visual inspection of the wafers (b2). In addition to the usual defects of the order of magnitude indicated in Comparative Example 1 and Example 1, the visual inspection (b2) established additional losses in yield of aooroximately 10% caused by incipient local etching attributable to the edge-polishing process. All the reject wafers were collected and underwent flash DSP (c) as described in the previous examples. Further visual inspection (d2) established that approximately 90% of the wafers machined in accordance with (c) fulfilled the requirements for further processing.

Accordingly, while a few embodiments of the present invention have been shown and described, it is to be understood that many changes and modifications may be made thereunto without departing from the spirit and scope of the invention as defined in the appended claims.

What is claimed is:

1. A process for producing a multiplicity of semiconductor wafers, comprising the following individual steps:

(a) simultaneously polishing a front side of each semiconductor wafer and a back side of each semiconductor wafer between rotating polishing plates with a polishing fluid being supplied to said polishing plates, the semiconductor wafer in each case resting in a cutout of a carrier and being kept on a specific geometric path, the carrier having a carrier thickness $t_{1L}$, and the semiconductor wafers having a starting thickness $t_0$ prior to polishing and a final thickness $t_1$ after the polishing, the thickness difference $t_0-t_{1L}$ being 15 $\mu$m to 100 $\mu$m, and the thickness difference $t_1-t_{1L}$ being 2 $\mu$m to 20 $\mu$m;

(b) assessing each semiconductor wafer in a quality inspection with regard to quality features which are stipulated for further processing;

(c) further simultaneously polishing a front side and a back side of each of those semiconductor wafers which, according to said quality inspection (b), do not satisfy the stipulated quality features, these semiconductor wafers resting in a carrier during polishing and having the starting thickness $t_1$ prior to polishing and a final thickness $t_2$ after polishing, and the carrier having a thickness $t_{2L}$ and the thickness difference $t_1-t_{2L}$ being 5 $\mu$m to 30 $\mu$m, and the thickness difference $t_2-t_{2L}$ being 2 $\mu$m to 10 $\mu$m; and (d) further assessing each of those semiconductor wafers which were fed to step (c) with regard to quality features stipulated for further processing.

2. The process as claimed in claim 1,
wherein the thickness $t_1$ is substantially equal for all the wafers which have been polished as described in step (a); and
wherein the thickness $t_2$ is substantially equal for all the wafers which have been polished as described in step (c).

3. The process as claimed in claim 1,
wherein the thickness difference $t_1-t_2$ is 2 $\mu$m to 10 $\mu$m.

4. The process as claimed in claim 1,
wherein the assessing in step (b) and in step (d) includes a geometry measurement.

5. The process as claimed in claim 1,
wherein the assessing in step (b) and in step (d) includes a visual inspection under strongly focused light.

6. The process as claimed in claim 1,
wherein the semiconductor wafers subjected to steps (a) to (d) are prepared by sawing a semiconductor crystal and rounding the edges of the semiconductor wafers produced by the sawing.

7. The process as claimed in claim 1,
wherein the semiconductor wafers subjected to steps (a) to (d) are prepared by sawing a semiconductor crystal and rounding the edges of and grinding the semiconductor wafers produced by the sawing.

8. The process as claimed in claim 1,
wherein the semiconductor wafers subjected to steps (a) to (d) are prepared by sawing a semiconductor crystal and rounding the edges of, grinding and etching the semiconductor wafers produced by the sawing.

9. The process as claimed in claim 1,
wherein after the process steps (a) to (d) have been carried out, a final polishing step aimed at achieving a haze-free surface is carried out on the front side of the multiplicity of semiconductor wafers.

10. The process as claimed in claim 1, comprising
applying a semiconductive epitaxial coating to the front side of the multiplicity of semiconductor wafers after the process steps (a) to (d) have been carried out or after the final polishing step.

11. The process as claimed in claim to 1, comprising polishing edges of the semiconductor wafers.

12. The process as claimed in claim 1, comprising providing the semiconductor wafers with a laser marking.

13. The process as claimed in claim 1, comprising heat-treating the semiconductor wafers.

* * * * *